(12) United States Patent
Kitajima et al.

(10) Patent No.: US 10,989,743 B2
(45) Date of Patent: Apr. 27, 2021

(54) POWER-DEMAND-VALUE CALCULATING SYSTEM, POWER-DEMAND-VALUE CALCULATING METHOD, AND RECORDING MEDIUM RECORDING POWER-DEMAND-VALUE CALCULATING PROGRAM

(71) Applicant: FUJITSU LIMITED, Kawasaki (JP)

(72) Inventors: Masayuki Kitajima, Yokohama (JP); Tetsuji Ishikawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 346 days.

(21) Appl. No.: 16/037,295

(22) Filed: Jul. 17, 2018

(65) Prior Publication Data
US 2018/0321288 A1 Nov. 8, 2018

Related U.S. Application Data

(63) Continuation of application No. PCT/JP2016/051639, filed on Jan. 21, 2016.

(51) Int. Cl.
*G01R 21/133* (2006.01)
*H02J 3/00* (2006.01)
(Continued)

(52) U.S. Cl.
CPC ....... *G01R 21/133* (2013.01); *G06Q 30/0202* (2013.01); *G06Q 50/06* (2013.01);
(Continued)

(58) Field of Classification Search
CPC .. G01B 21/133; G06Q 30/0202; G06Q 50/06; H02J 2203/20; H02J 3/00; H02J 3/003
See application file for complete search history.

(56) References Cited

U.S. PATENT DOCUMENTS

2004/0254899 A1* 12/2004 Abe ................... G06Q 30/0283
705/412
2010/0204845 A1  8/2010 Ohuchi et al.
(Continued)

FOREIGN PATENT DOCUMENTS

CN           102663518 A     9/2012
JP           6-105465 A      4/1994
(Continued)

OTHER PUBLICATIONS

Extended (Supplementary) European Search Report dated Dec. 19, 2018, issued in counterpart European Patent application No. 16886311.6. (10 pages).
(Continued)

*Primary Examiner* — Mischita L Henson
(74) *Attorney, Agent, or Firm* — Westerman, Hattori, Daniels & Adrian, LLP

(57) ABSTRACT

A power-demand-value calculating system includes a storage device and an arithmetic device. The storage device stores data of combinations of temperatures and power result values. The arithmetic device selects data equal to or higher than a predetermined temperature from the storage device and, calculates, when the power result values corresponding to the temperatures of the selected data are smaller than a power calculation value which is calculated from a regression formula derived from the data of the combinations and the temperatures of the selected data, a maximum power demand value based on the temperatures equal to or higher than the predetermined temperature and the regression formula.

20 Claims, 13 Drawing Sheets

(51) Int. Cl.
*G06Q 30/02* (2012.01)
*G06Q 50/06* (2012.01)

(52) U.S. Cl.
CPC ............... *H02J 3/00* (2013.01); *H02J 3/003* (2020.01); *H02J 2203/20* (2020.01)

(56) References Cited

U.S. PATENT DOCUMENTS

| | | | |
|---|---|---|---|
| 2012/0095608 A1* | 4/2012 | Murakami | G06Q 10/063 700/291 |
| 2014/0303797 A1* | 10/2014 | Kitajima | G05B 15/02 700/291 |
| 2015/0310461 A1 | 10/2015 | Lee et al. | |
| 2016/0266181 A1 | 9/2016 | Kawaguchi et al. | |

FOREIGN PATENT DOCUMENTS

| | | |
|---|---|---|
| JP | 2008-25951 A | 2/2008 |
| JP | 2009-225613 A | 10/2009 |
| JP | 2015-139283 A | 7/2015 |
| WO | 2015/075794 A1 | 5/2015 |

OTHER PUBLICATIONS

Entso-E: "Summer Outlook Report 2015 and Winter Review 2014/2015", May 27, 2015, pp. 1-175[retrieved on Dec. 4, 2018], URL:https://docstore.entsoe.eu/Documents/SDC%20documents/SOAF/150527_SOR15_report.pdf, cited in Extended (Supplementary) European Search Report dated Dec. 19, 2018. (157 pages).

International Search Report dated Apr. 12, 2016, issued in counterpart International Application No. PCT/JP2016/051639 (1 page).

Office Action dated Jul. 12, 2019, issued in counterpart EP application No. 16886311.6. (7 pages).

"Generation Adequacy Report on the electricity supply-demand balance in France", Rte, (Jan. 1, 2015) Jan. 1, 2015, XP055602916, Retrieved from the Internet: URL: https://www.rte-france.com/sites/default/files/2016_01_13generation_adequacy_report_executive_summary.pdf.pdf [retrieved on Jul. 5, 2019], cited in EP Office Action dated Jul. 12, 2019. (117 pages).

Office Action dated Jan. 28, 2020, issued in counterpart EP Application No. 16 886 311.6. (7 pages).

* cited by examiner

United States Patent US 10,989,743 B2 …

POWER-DEMAND-VALUE CALCULATING SYSTEM, POWER-DEMAND-VALUE CALCULATING METHOD, AND RECORDING MEDIUM RECORDING POWER-DEMAND-VALUE CALCULATING PROGRAM

CROSS-REFERENCE TO RELATED APPLICATION

This application is a continuation application of International Application PCT/JP2016/051639 filed on Jan. 21, 2016 and designated the U.S., the entire contents of which are incorporated herein by reference.

FIELD

The embodiments relates to a power-demand-value calculating system, a power-demand-value calculating method, and a power-demand-value calculating program.

BACKGROUND

Currently, a variety of apparatuses that consume electric power and operate are used in various places.

Related art is disclosed Japanese Laid-open Patent Publication No. 2015-139283, International Publication Pamphlet No. WO 2015/075794, or Japanese Laid-open Patent Publication No. 2008-25951.

SUMMARY

According to one aspect of the embodiments, a power-demand-value calculating system includes: a storage device configured to store data of combinations of temperatures and power result values; and an arithmetic device configured to: select data equal to or higher than a predetermined temperature from the storage device; and, calculate, when the power result values corresponding to the temperatures of the selected data are smaller than a power calculation value which is calculated from a regression formula derived from the data of the combinations and the temperatures of the selected data, a maximum power demand value based on the temperatures equal to or higher than the predetermined temperature and the regression formula The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

For example, predictions of power demands in regions, facilities, and the like are sometimes performed by companies that supply electric power, companies that use electric power, and the like. For example, there is a proposal to predict, based on a power demand peak value or a power demand peak time specified from electricity use amounts for each of hours in days in the past, a power demand peak value or a power demand peak time period of a prediction target day when characteristics (a maximum temperature, a day of week, weather, humidity, and the like) coincide with characteristics in the days in the past.

There is also a proposal to predict power consumption with respect to an outdoor air temperature in a house, a shop, a condominium, or the like. In this proposal, power consumption value data with less action power that fluctuates according to an action of a resident in total power consumption is selected and a relation between an outdoor air temperature and power consumption is extracted based on the selected power consumption value data.

Note that, there is also a proposal to detect skin temperatures of people present in a plurality of rooms in which air conditioners are provided and, when demand power is about to exceed contracted maximum demand power, determine, based on the detected skin temperatures of the people present in the rooms, an air conditioner to be stopped.

When a prediction of a maximum power demand is performed, deviation of a prediction result and an actual maximum power demand is a problem. For example, it is conceivable to determine, based on the prediction result of the maximum power demand, contract power and pay a rate corresponding to the contract power to a company that supplies electric power. In this case, when the prediction result of the maximum power demand exceeds an actual demand, excess cost occurs because of a difference between the prediction result and the actual demand.

For example, a power-demand-value calculating system, a power-demand-value calculating method, and a power-demand-value calculating program for stopping a maximum power demand in future from being overestimated may be provided.

Embodiments are explained below with reference to the drawings.

First Embodiment

Figure 1:
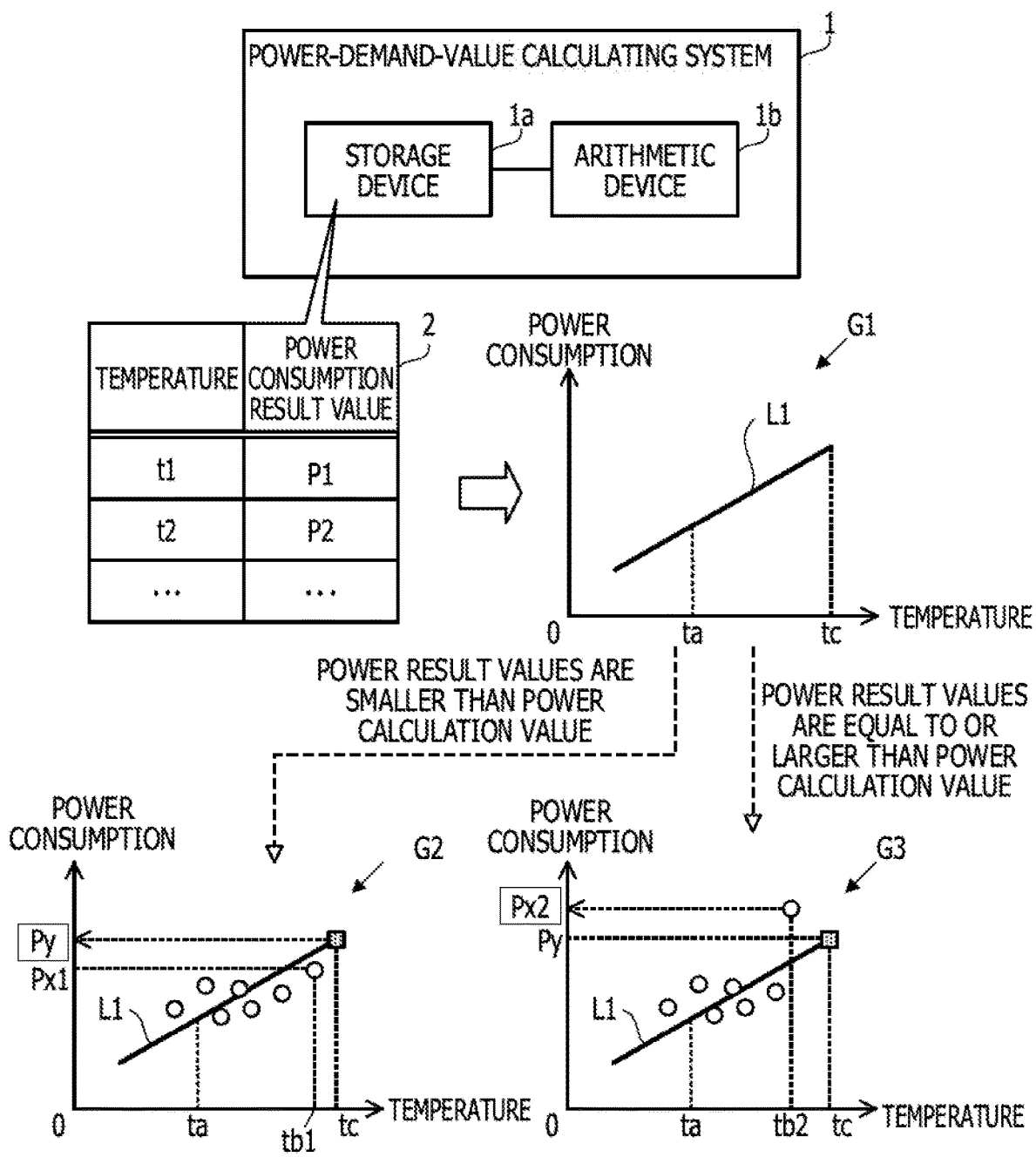
FIG. 1 is a diagram illustrating a power-demand-value calculating system in a first embodiment.

FIG. 1 is a diagram illustrating a power-demand-value calculating system in a first embodiment. A power-demand-value calculating system 1 calculates a value of power consumption (a power demand value) predicted for future from results of power consumption in the past corresponding to temperatures. The power demand value predicted by the power-demand-value calculating system 1 is maximum power consumption expected in a predetermined period in future (for example, the next one year).

The power-demand-value calculating system 1 includes a storage device 1a and an arithmetic device 1b. The storage device 1a may be a volatile storage device such as a random access memory (RAM) or may be a nonvolatile storage device such as a hard disk drive (HDD) or a flash memory. The arithmetic device 1b can include a central processing unit (CPU), a digital signal processor (DSP), an application specific integrated circuit (ASIC), or a field programmable gate array (FPGA). The arithmetic device 1b may be a processor that executes a program. The "processor" referred to herein can include a set of a plurality of processors (a multiprocessor). The power-demand-value calculating system 1 may be what is called "computer".

The storage device 1a stores a table 2. The table 2 is information including a plurality of combinations of temperatures and power consumption result values. One combination of the temperature and the power consumption result value in the table 2 can be also be referred to as one record (or data). For example, the table 2 illustrates a correspondence relation between a maximum temperature and a maximum power consumption result value in each of days in the past. That is, one record indicates a correspondence relation between a maximum temperature and a maximum power consumption result value in certain one day in the past. In the table 2, a plurality of records are recorded in such a manner as a record including a temperature t1 and a power consumption result value P1 and a record including a temperature t2 and a power consumption result value P2.

The arithmetic device 1b selects records equal to or higher than a predetermined temperature from the storage device 1a. For example, the predetermined temperature is represented as ta. The arithmetic device 1b selects records including temperatures equal to or higher than the predetermined temperature ta among the plurality of records registered in the table 2.

When power result values corresponding to the temperatures included in the selected records are smaller than a power calculation value calculated from a regression formula, which is calculated from the plurality of records, and the temperatures of the selected records, the arithmetic device 1b calculates, based on the temperatures equal to or higher than the predetermined temperature and the regression formula, a maximum power demand value.

For example, the arithmetic device 1b calculates a regression formula representing a regression line L1 from the plurality of records registered in the table 2. A graph G1 represents the regression line L1 indicating a relation between temperature and power consumption. The regression formula may be a linear expression or a quadratic or higher-order expression. In the example illustrated in FIG. 1, the regression line L1 is a straight line and the regression formula is the linear expression. In this case, the regression formula can be represented by power demand (kW: kilowatt) =demand change rate (a)×temperature (° C.)+b. For example, the arithmetic device 1b can calculate, based on the records of the table 2, the regression formula using the method of least squares (a method other than the method of least squares may be used).

Subsequently, the arithmetic device 1b compares the power result values corresponding to the temperatures included in the records selected from the table 2 and power calculation values calculated from the regression formula and the temperatures of the selected records. For example, the power calculation value is a value of power consumption calculated by substituting a temperature in the calculated regression formula. The arithmetic device 1b sets the temperature substituted in the regression formula to calculate the power calculation value to a maximum temperature tc predicted for the next year. The maximum temperature tc may be a maximum temperature among the temperatures included in the selected records. Alternatively, the arithmetic device 1b may predict the maximum temperature tc in the next year from a fluctuation tendency of maximum temperatures in years in the past. For example, it is conceivable that the arithmetic device 1b performs a regression analysis with respect to the years in the past and the maximum temperatures in the years and predicts the maximum temperature tc in the next year from the derived regression formula. A value obtained by substituting the temperature tc in the regression formula corresponding to the regress line L1 is represented as power calculation value Py.

The arithmetic device 1b compares a power result value Px1, which is the largest among power result values corresponding to the temperatures equal to or higher than the predetermined temperature ta included in the table 2, and the power calculation value Py. The power result value Px1 is a power result value corresponding to a temperature tb1 (ta≤tb1≤tc). The power result value Px1 is smaller than the power calculation value Py (in the case of a graph G2). In this case, the arithmetic device 1b calculates, based on the temperatures equal to or higher than the predetermined temperature ta and the regression formula corresponding to the regression line L1, a maximum power demand value. Specifically, it is conceivable that the arithmetic device 1b sets, as the maximum power demand value, the power calculation value Py obtained by substituting the maximum temperature tc in the regression formula.

On the other hand, in some case, a maximum value of the power result values corresponding to the temperatures equal to higher than the predetermined temperature ta is a power result value Px2 (≥Py) (the power result value Px2 is equal to or larger than the power calculation value Py) (in the case of a graph G3). The power result value Px2 is a power result value corresponding to a temperature tb2 (ta≤tb2≤tc). In this case, the arithmetic device 1b sets the power result value Px2 as the maximum power demand value.

In this way, when the power result values recorded in the table 2 with respect to the temperatures equal to higher than the predetermined temperature ta are smaller than the power calculation value calculated using the regression formula, the power-demand-value calculating system 1 calculates the maximum power demand value according to the regression formula. Because a power demand value tends to increase as temperature is higher, a reason for focusing on the temperatures equal to or higher than the predetermined temperature ta is to narrow down a determination target temperature range making use of this tendency. When the power result value is smaller than the power calculation value calculated using the regression formula, possibility that a power demand amount in future exceeds the maximum power demand value calculated from the regression formula is considered to be relatively low. Therefore, when the power result value is smaller than the power calculation value calculated using the regression formula, by calculating the maximum power demand value from the regression formula, it is possible to stop a maximum power demand value in future from being overestimated.

On the other hand, when the power result value is equal to or larger than the power calculation value calculated using the regression formula, the power-demand-value calculating system 1 sets a result value of a maximum power demand in the past as a predicted maximum power demand value. In this case, this is because the possibility that a power demand amount in future exceeds the maximum power demand value calculated from the regression formula is considered to be relatively high. By predicting the result value of the maximum power demand in the past as a maximum power demand value in the next term, it is possible to stop a maximum power demand value in future from being underestimated.

Note that, when obtaining the power result values Px1 and Px2, the arithmetic device 1b may exclude an abnormal value from the power consumption result values recorded in the table 2. For example, it is conceivable that the arithmetic device 1b calculates a standard deviation of the power consumption result values recorded in the table 2, regards, as an abnormal value, a power consumption result deviating from an allowable range of the power consumption result values represented by the standard deviation, and excludes the power consumption result from determination targets. By excluding the abnormal value in this way, it is also possible to improve prediction accuracy of the maximum power demand value.

In the example explained above, the prediction target period is the next one year. However, a period of another length such as a half year may be set as the prediction target. In that case, the arithmetic device 1b can also calculate, using power consumption result values in the same period (for example, April to September) in the past, a maximum power demand value in the same period in future according to the method illustrated in the first embodiment.

Second Embodiment

Figure 2:
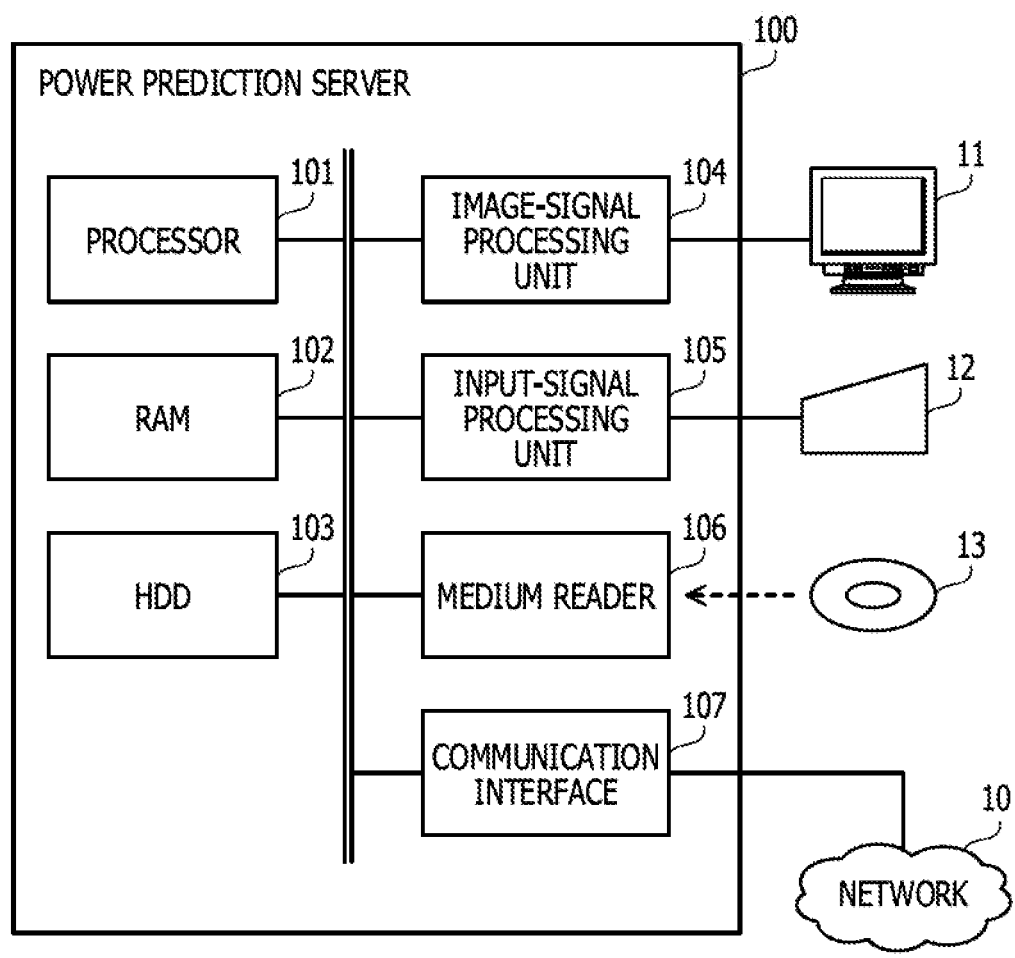
FIG. 2 is a diagram illustrating a hardware example of a power prediction server in a second embodiment.

FIG. 2 is a diagram illustrating a hardware example of a power prediction server in a second embodiment. A power prediction server 100 is a server computer that predicts a power demand in a facility such as a factory or a laboratory. The power prediction server 100 includes a processor 101, a RAM 102, a HDD 103, an image-signal processing unit 104, an input-signal processing unit 105, a medium reader 106, and a communication interface 107. The units are connected to a bus of the power prediction server 100.

The processor 101 controls information processing of the power prediction server 100. The processor 101 may be a multiprocessor. The processor 101 is, for example, a CPU, a DSP, an ASIC, or a FPGA. The processor 101 may be a combination of two or more elements among the CPU, the DSP, the ASIC, the FPGA, and the like.

The RAM 102 is a main storage device of the power prediction server 100. The RAM 102 temporarily stores a program of an operating system (OS) and at least a part of application programs to be executed by the processor 101. The RAM 102 stores various data used for processing by the processor 101.

The HDD 103 is an auxiliary storage device of the power prediction server 100. The HDD 103 magnetically writes data in and reads out data from a magnetic disk incorporated in the HDD 103. The HDD 103 stores the program of the OS, the application programs, and the various data. The power prediction server 100 may include an auxiliary storage device of another type such as a flash memory or a solid state drive (SSD) or may include a plurality of auxiliary storage devices.

The image-signal processing unit 104 outputs, according to a command from the processor 101, an image to a display 11 connected to the power prediction server 100. As the display 11, a cathode ray tube (CRT) display, a liquid crystal display, or the like can be used.

The input-signal processing unit 105 acquires an input signal from an input device 12 connected to the power prediction server 100 and outputs the input signal to the processor 101. As the input device 12, for example, a pointing device such as a mouse or a touch panel and a keyboard can be used.

The medium reader 106 is a device that reads programs and data recorded in the recording medium 13. As the recording medium 13, for example, a magnetic disk such as a flexible disk (FD) or a HDD, an optical disk such as a compact disc (CD) or a digital versatile disc (DVD), or a magneto-optical disk (MO) can be used. As the recording medium 13, for example, a nonvolatile semiconductor memory such as a flash memory card can also be used. The medium reader 106 stores the program and the data read from the recording medium 13 in the RAM 102 or the HDD 103, for example, according to a command from the processor 101.

The communication interface 107 performs communication with other devices via a network 10. The communication interface 107 may be a wired communication interface or may be a wireless communication interface.

Figure 3:
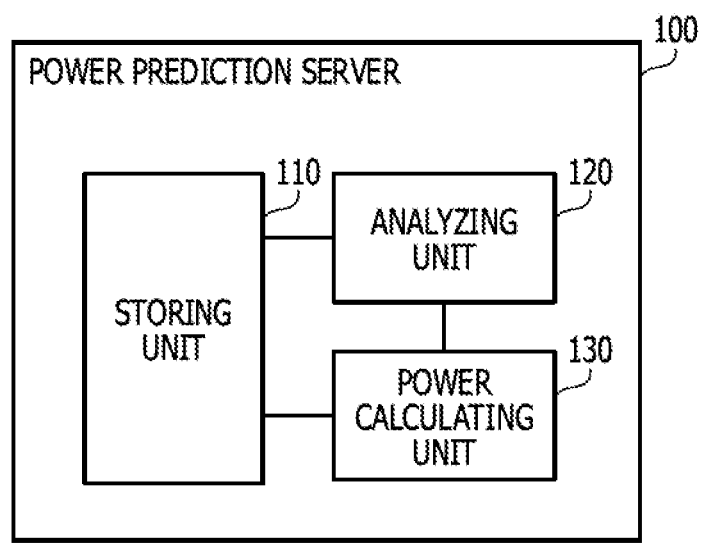
FIG. 3 is a diagram illustrating a function example of the power prediction server.

FIG. 3 is a diagram illustrating a function example of the power prediction server. The power prediction server 100 includes a storing unit 110, an analyzing unit 120, and a power calculating unit 130. The storing unit 110 is implemented as a storage region secured in the RAM 102 or the HDD 103. The analyzing unit 120 and the power calculating unit 130 are implemented by the processor 101 executing the program stored in the RMA 102.

The storing unit 110 stores a power result table. The power result table is information in which, for each of dates in the past, a maximum temperature and a maximum of a result value of power consumption (referred to as power result value) of the day are recorded. That is, the power result table is information in which a plurality of combinations of dates, temperatures, and power result values are registered. One record of the power result table is one combination of a date, a temperature, and a power result value.

The analyzing unit 120 analyzes, based on the power result table stored in the storing unit 110, presence or absence of a correlation between temperature and power consumption. For example, a threshold (for example, 0.7) of a correlation coefficient for determining that there is the correlation between temperature and power consumption is recorded in the storing unit 110 in advance. The analyzing unit 120 determines whether the absolute value of a correlation coefficient calculated from the power result table is equal to or larger than the threshold to determine presence or absence of the correlation between temperature and power consumption stored in the power result table. For example, when the absolute value of the correlation coefficient is equal to or larger than the threshold, "correlation is present". When the absolute value of the correlation coefficient is smaller than the threshold, "correlation is absent". A correlation coefficient "c" can be calculated by Expression (1) described below. Note that xa indicates an arithmetic mean of xi and ya indicates an arithmetic mean of yi.

[Math. 1]

$$c = \frac{\sum_{i=1}^{n}(x_i - x_a)(y_i - y_a)}{\sqrt{\sum_{i=1}^{n}(x_i - x_a)^2}\sqrt{\sum_{i=1}^{n}(y_i - y_a)^2}} \quad (1)$$

When the analyzing unit 120 determines that the correlation is present, the power calculating unit 130 calculates, based on the power result table, a maximum power demand value in the next term (for example, next one year). Specifically, the power calculating unit 130 specifies, based on the power result table, a temperature range in which power consumption is relatively large and calculates an expression (a regression formula) representing a relation between temperature and power consumption. For example, when contract power for one year is determined as contract power for the next term, the power calculating unit 130 may calculate, based on a record of temperature and power consumption within one year in the past, the regression formula. The power calculating unit 130 calculates the regression formula according to the method of least squares using values of temperature and values of power consumption recorded in the power result table. The regression formula may be a linear expression or a quadratic or higher-order expression.

The power calculating unit 130 calculates a maximum power demand value (a prediction value) in the next term according to comparison of a power result value in the power result table and a power calculation value calculated from the regression formula. The power calculating unit 130 outputs the calculated maximum power demand value to the display 11. For example, a user can confirm the maximum power demand value displayed on the display 11 and determine contract power in the next term.

Figure 4:
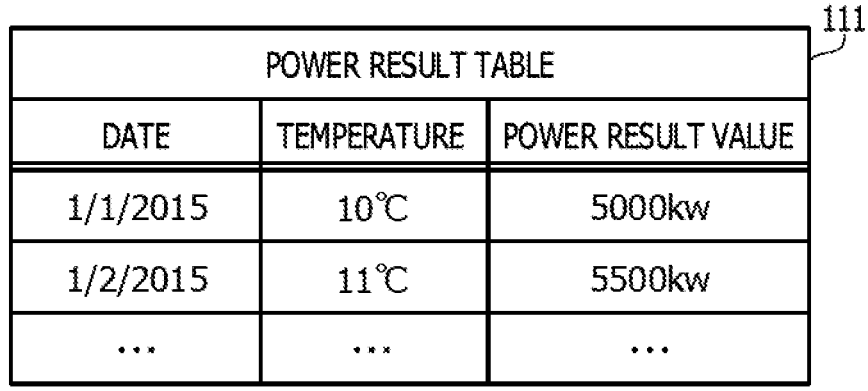
FIG. 4 is a diagram illustrating an example of a power result table.

FIG. 4 is a diagram illustrating an example of the power result table. A power result table 111 is stored in the storing unit 110. The power result table 111 includes items of a date, a temperature, and a power result value.

A date is registered in the item of the date. A maximum temperature in the date is registered in the item of the temperature. A result value of maximum power consumption in the date is registered in the item of the power result value. For example, in the power result table 111, information with the date "2015/1/1", the temperature "10° C.", and the power result value "5000 kW" is registered. This indicates that a maximum temperature on Jan. 1, 2015 was 10° and a result value of maximum power consumption was 5000 kW.

Figure 5:
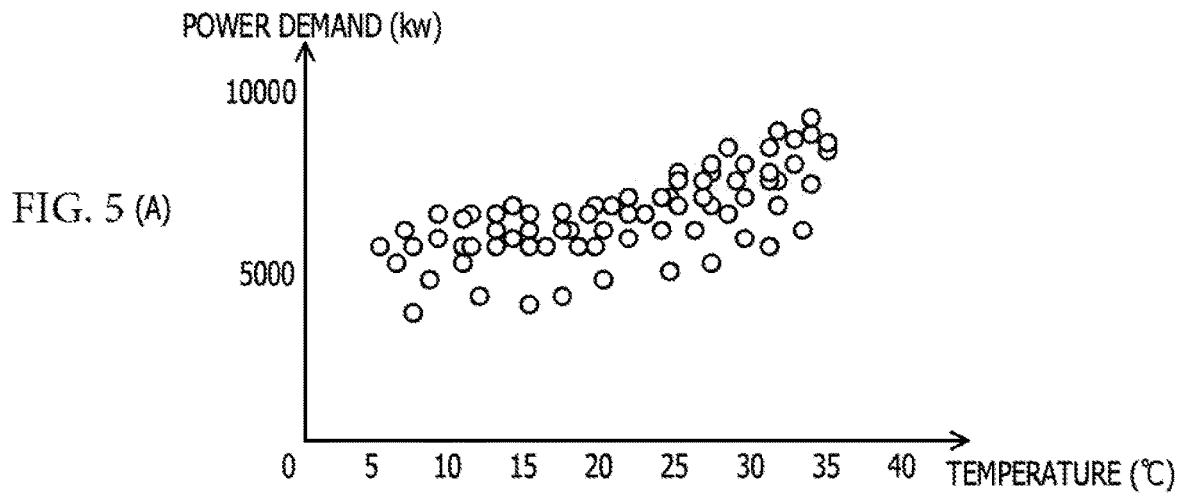
FIGS. 5(A)-5(C) are diagrams illustrating an analysis example.
Figure 5:
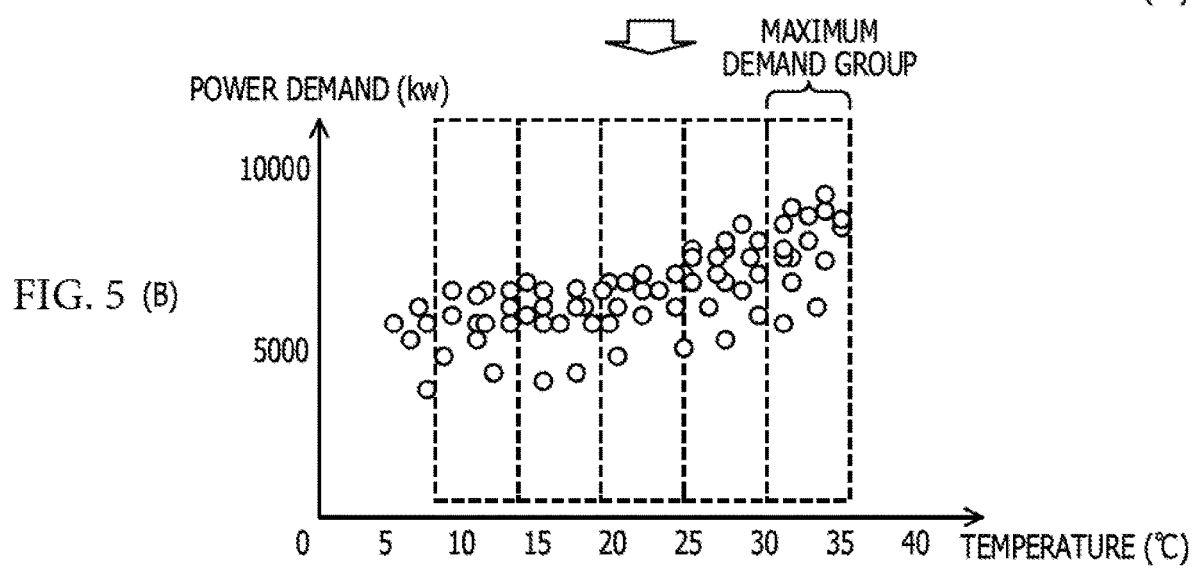
Figure 5:
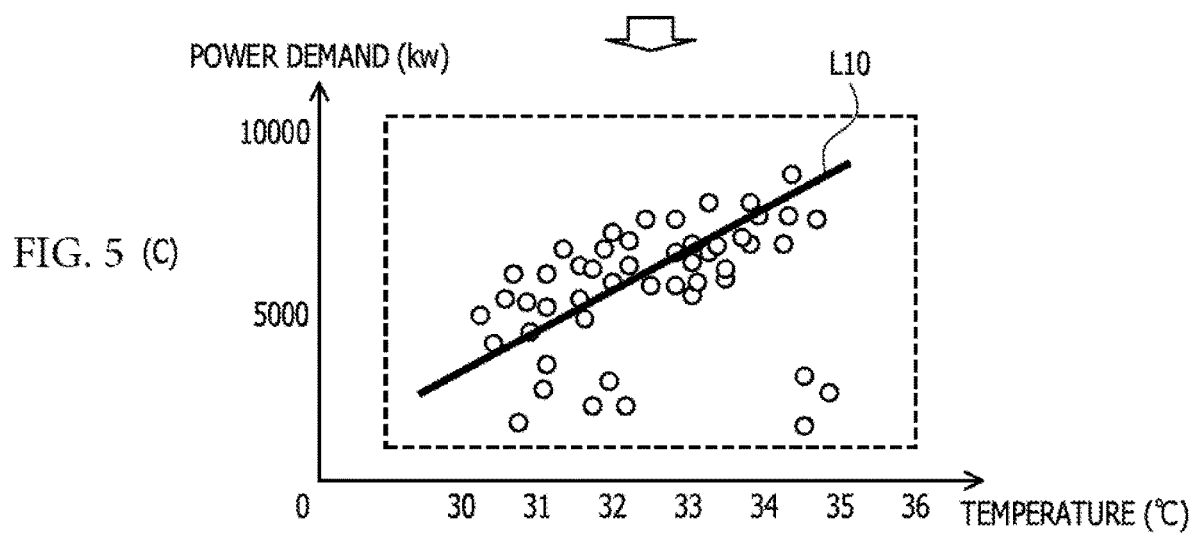

FIG. 5 is a diagram illustrating an analysis example. FIG. 5(A) illustrates a graph in which a temperature and a power result value are plotted based on the power result table 111. The horizontal axis indicates a temperature (unit is ° C.) and the vertical axis indicates a result value of power consumption (unit is kW) (the same applies to graphs referred to below).

FIG. 5(B) illustrates an example in which a temperature range is grouped into a plurality of ranges. For example, the analyzing unit 120 divides a range of a minimum temperature to a maximum temperature into five and causes plotted points to belong to a plurality of groups (the number of divisions can be optionally determined). The analyzing unit 120 sets, as a maximum demand group, a group corresponding to a maximum temperature zone among the plurality of groups. The power prediction server 100 performs a regression analysis on the maximum demand group. The groups are narrowed down to the maximum demand group to perform regression analysis because, in a relatively low temperature zone, a correlation between temperature and a result of power consumption tends to be relatively small. That is, by narrowing down the groups to the maximum demand group to perform the regression analysis, a maximum power demand is stopped from being underestimated according to a power result value in the relatively low temperature zone.

FIG. 5(C) illustrates a regression line L10 obtained using power result values belonging to the maximum demand group. The regression line L10 is a straight line. That is, a regression formula corresponding to the regression line L10 is a linear expression. Specifically, the regression formula of the regression line L10 is represented by Expression (2).

$$P = (a \times T + b) \quad (2) \qquad \text{[Math. 2]}$$

In Expression (2), P represents a power value (unit is kW), T represents temperature (unit is ° C.), "a" represents a power demand change rate (unit is kW/° C.), and "b" represents an intercept (unit is kW). For example, the power calculating unit 130 can calculate values of "a" and "b" of Expression (2) according to the method of least squares for temperatures and power result values belonging to the maximum demand group. Note that, in this example, the regression formula is represented by the linear expression concerning temperature. However, the regression formula may be represented by a quadratic or higher-order formula concerning temperature.

Figure 6:
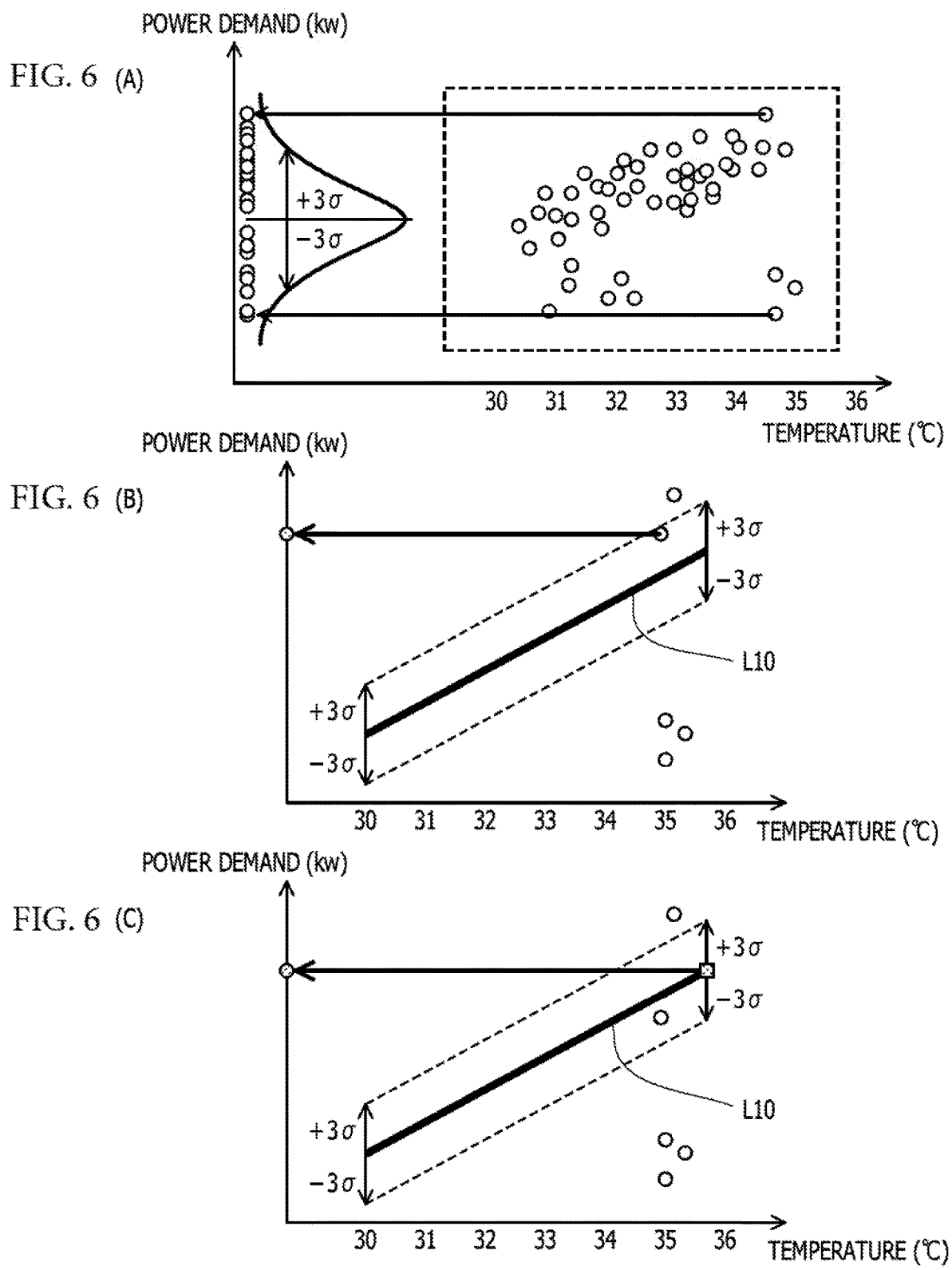
FIGS. 6(A)-6(C) are diagrams illustrating the analysis example (following FIG. 5).

FIG. 6 is a diagram illustrating the analysis result (following FIG. 5). FIG. 6(A) represents fluctuation in the power result values belonging to the maximum demand group. For example, among power demands belonging to the maximum demand group, there is a case in which power consumption suddenly decreases or increases irrespective of temperature. The power calculating unit 130 discards such a case as an abnormal value. Specifically, the power calculating unit 130 calculates $Z\sigma$ (Z is a positive constant), which is a constant time of a standard deviation $\sigma$, as an indicator indicating fluctuation in the power result values belonging to the maximum demand group. The power calculating unit 130 sets, as normal values, values within a range of $P(T)-\sigma$ or more and $P(T)+Z\sigma$ or less among the power result values. On the other hand, the power calculating unit 130 sets, as abnormal values, values smaller than $P(T)-Z\sigma$ or larger than $P(T)+Z\sigma$ among the power result values. A value of Z can be optionally determined. As an example, the power calculating unit 130 sets Z as Z=3. In this way, the power calculating unit 130 predicts a maximum power demand in future according to the power results values within the range of the normal values to increase accuracy of prediction. Expression $P(T)+Z\sigma$ for determining an upper limit of the normal values can be referred to as correlation formula with respect to the regression formula $P(T)$.

FIGS. 6(B) and 6(C) illustrate two patterns of determination of the maximum power demand by the power calculating unit 130. Specifically, the power calculating unit 130 compares power result values within the normal range and a power calculation value calculated using Expression (2). For example, the power calculating unit 130 can calculate a power calculation value by predicting a maximum temperature in the next term from a history of maximum temperatures in the past and substituting the predicted maximum temperature in Expression (2).

When the power result values within the normal range are equal to or larger than the power calculation value, the power calculating unit 130 sets a maximum among the power result values within the normal range as a prediction value of a maximum power demand in the next term (in the case of FIG. 6(B)).

When the power result values within the normal range are smaller than the power calculation value, the power calculating unit 130 sets, as the prediction value of the maximum power demand in the next term, a value calculated by substituting a maximum temperature in the next term in Expression (2) (in the case of FIG. 6(C)).

A processing procedure by the power prediction server 100 is explained.

Figure 7:
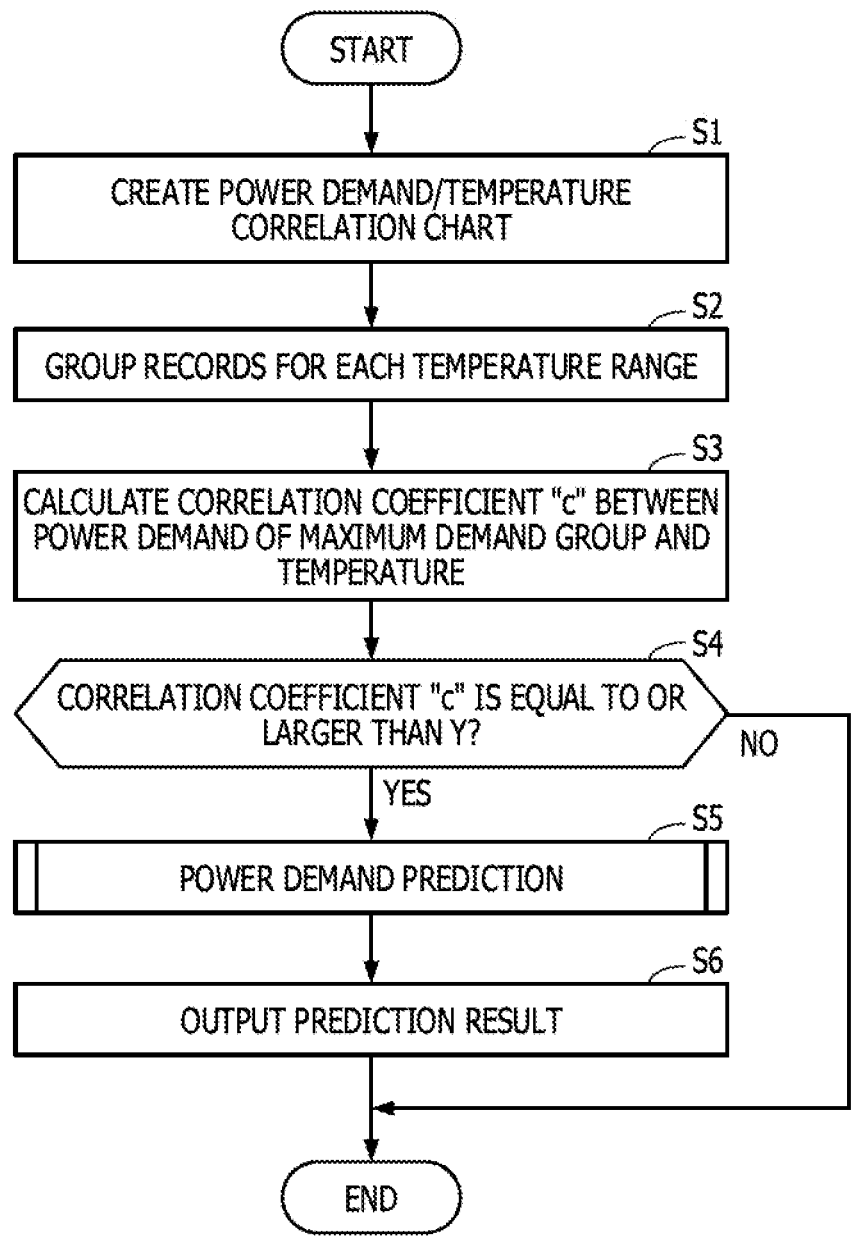
FIG. 7 is a flowchart illustrating an example of analysis processing.

FIG. 7 is a flowchart illustrating an example of analysis processing. The processing illustrated in FIG. 7 is explained below according to step numbers. For example, the power prediction server 100 stars the following procedure when receiving an execution input for a power demand prediction for the next term by the user.

(S1) The analyzing unit 120 creates, based on the power result table 111, a power demand/temperature correlation charge (the graph of FIG. 5(A)). The analyzing unit 120 may cause the display 11 to display, according to progress of the processing, the power demand/temperature correlation chart and subsequent figures (figures of FIG. 5(B), FIG. 5(C), and FIG. 6 and the like).

(S2) The analyzing unit 120 groups records of the power result table 111 for each of temperature ranges. As explained above, the analyzing unit 120 divides a temperature range between a maximum temperature and a minimum temperature into X (X is an integer equal to or larger than 2) to perform grouping. Consequently, a plurality of records of the power result table 111 are classified into a plurality of groups. For example, a value such as 3, 5, or 10 can be used as X.

(S3) The analyzing unit 120 calculates the correlation coefficient "c" between a power demand (a power result value) of a maximum important group among the plurality of groups and temperature. Specifically, the analyzing unit 120 can calculate the correlation coefficient "c" using Expression (1).

(S4) The analyzing unit 120 determines whether the correlation coefficient "c" is equal to or larger than Y. When the correlation coefficient "c" is equal to or larger than Y, the analyzing unit 120 advances the processing to step S5. When the correlation coefficient "c" is smaller than Y, the analyzing unit 120 ends the processing. For example, a value such as 0.5, 0.7, or 0.8 can be used as Y.

(S5) The power calculating unit 130 performs a power demand prediction. Details of processing are explained below.

(S6) The power calculating unit 130 outputs a prediction result. Specifically, the power calculating unit 130 causes the display 11 to display a prediction result of a maximum power demand value in the next term. The user can confirm the prediction result of the maximum power demand value displayed on the display 11 and determine contract power in the next term.

X and Y described above are variables. The variable X determines the number of divisions (equivalent to the number of groups) in grouping a temperature zone. When the number of divisions is too small, data having relatively small relationship with a maximum power demand is included in targets of a regression analysis and prediction accuracy is deteriorated. On the other hand, when the number of divisions is too large, target records of the regression analysis decreases and the prediction accuracy is deteriorated.

The variable Y is a threshold with respect to a correlation coefficient (referred to as correlation coefficient threshold). When the correlation coefficient threshold is too small, records having a relatively weak correlation are included in the targets of the regression analysis and the prediction accuracy is deteriorated. On the other hand, when the correlation coefficient threshold is tool large, a frequency for performing a prediction answer of the maximum power demand decreases. Values corresponding to operation can be set as the variables X and Y.

Subsequently, the procedure of step S5 is specifically explained.

Figure 8:
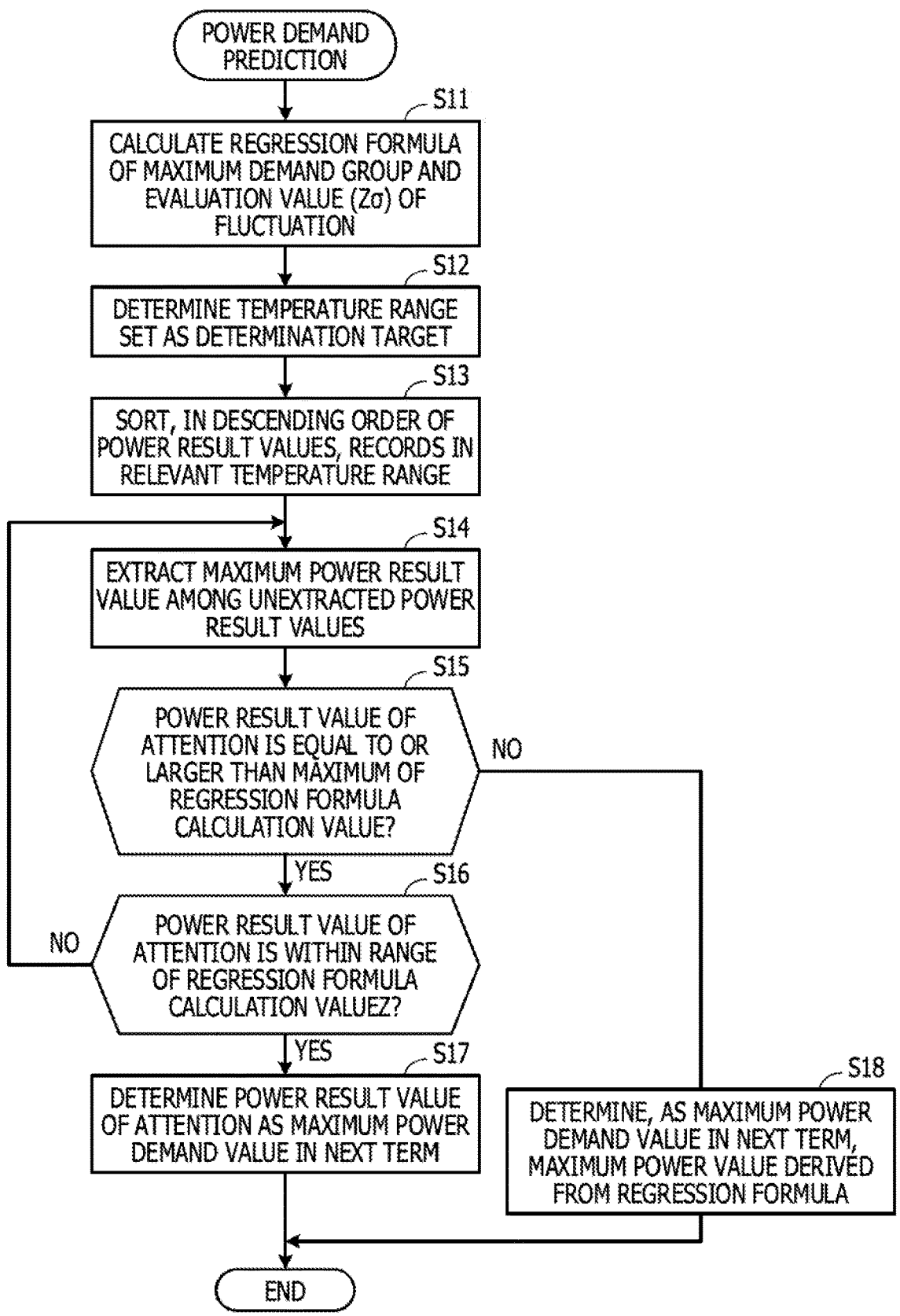
FIG. 8 is a flowchart illustrating an example of a power demand prediction.

FIG. 8 is a flowchart illustrating an example of the power demand prediction. Processing illustrated in FIG. 8 is explained below according to step numbers. A procedure illustrated in FIG. 8 is equivalent to step S5 in FIG. 7.

(S11) The power calculating unit 130 calculates a regression formula (Expression (2)) of the maximum demand group according to the regression analysis based on the power result table 111. The power calculating unit 130 calculates an evaluation value ($Z\sigma$) of fluctuation in power result values in the records of the power result table 111. The power calculating unit 130 only has to calculate the regression formula and the evaluation value $Z\sigma$ concerning records belonging to the maximum demand group among the plurality of records included in the power result table 111. Note that a value such as 3.0, 4.0, or 6.0 can be used as Z.

(S12) The power calculating unit 130 determines a temperature range set as a determination target in the following processing. Specifically, the power calculating unit 130 predicts a maximum temperature in the next term from changes of temperatures in the past and sets the maximum temperature as an upper limit value Tu of the temperature range. The power calculating unit 130 may use the regression analysis for the prediction of the maximum temperature in the next term as explained in detail below. The power calculating unit 130 determines, based on the predicted maximum temperature, a lower limit value Td of the temperature range. For example, it is conceivable to set, as the lower limit value Td, a value obtained by subtracting a predetermined temperature from the upper limit value Tu. More specifically, the power calculating unit 130 sets the lower limit value Td as the lower limit value Td=Tu−7(° C.) (the value subtracted from the upper limit value Tu can be optionally determined according to operation). In this case, a determination target temperature range is Td(° C.) or more and Tu(° C.) or less. However, as explained below, another method may be adopted as a method of determining the upper limit value and the lower limit value of the temperature range.

(S13) The power calculating unit 130 sorts, in descending order of power result values, records in the temperature range calculated in step S12.

(S14) The power calculating unit 130 extracts, with respect to a result of the sort in step S13, a maximum power result value among unextracted power result values. That is, the power calculating unit 130 extracts the power result values one by one in descending order from the sort result of the power result values in step S13. The power result value extracted in step S14 is referred to as "power result value of attention" in the following explanation of steps.

(S15) The power calculating unit 130 determines whether the power result value of attention is equal to or larger than a maximum (that is, a power calculation value) of a calculation value by the regression formula (a regression formula calculation value). When the power result value of attention is equal to or larger than the maximum of the regression formula calculation value, the power calculating unit 130 advances the processing to step S16. When the power result value of attention is smaller than the maximum of the regression formula calculation value, the power calculating unit 130 advances the processing to step S18.

(S16) The power calculating unit 130 determines whether the power result value of attention is within a range of a regression formula calculation value $P(Tx)\pm Z\sigma$ at a temperature Tx corresponding to the power result value. When the power result value of attention is within the range of the regression calculation value $\pm Z\sigma$, the power calculating unit 130 determines that the power result value is a normal value and advances the processing to step S17. When the power result value of attention is not within the range of the regression calculation value $\pm Z\sigma$, the power calculating unit 130 determines that the power result value is an abnormal value and advances the processing to step S14 (changes the power result value of attention and repeats the processing).

(S17) The power calculating unit 130 determines the power result value of attention as a maximum power demand value in the next term. The power calculating unit 130 ends the processing.

(S18) The power calculating unit 130 determines, as the maximum power demand value in the next term, a maximum power value derived from the regression formula. Specifically, the power calculating unit 130 determines, as the maximum power demand value in the next term, a power value $P(Tu)$ with respect to the maximum temperature Tu predicted in step S12. The power calculating unit 130 ends the processing.

Z described above is a variable. The variable Z is used to determine whether a power result value is a normal value or an abnormal value according to the determination in step S16. As Z is smaller, an allowable range for determining the power result value as normal decreases. Possibility of predicting, as a maximum power demand value, a value calculated from the regression formula increases. As Z is larger, the allowable range for determining that the power result value is normal increases. Possibility of predicting a maximum power demand from the power result value rather than the value calculated from the regression formula increases. A value corresponding to operation can be set as the variable Z.

In step S12, the maximum temperature in the next term is predicted by the regression analysis. For example, a method explained below is conceivable.

Figure 9:
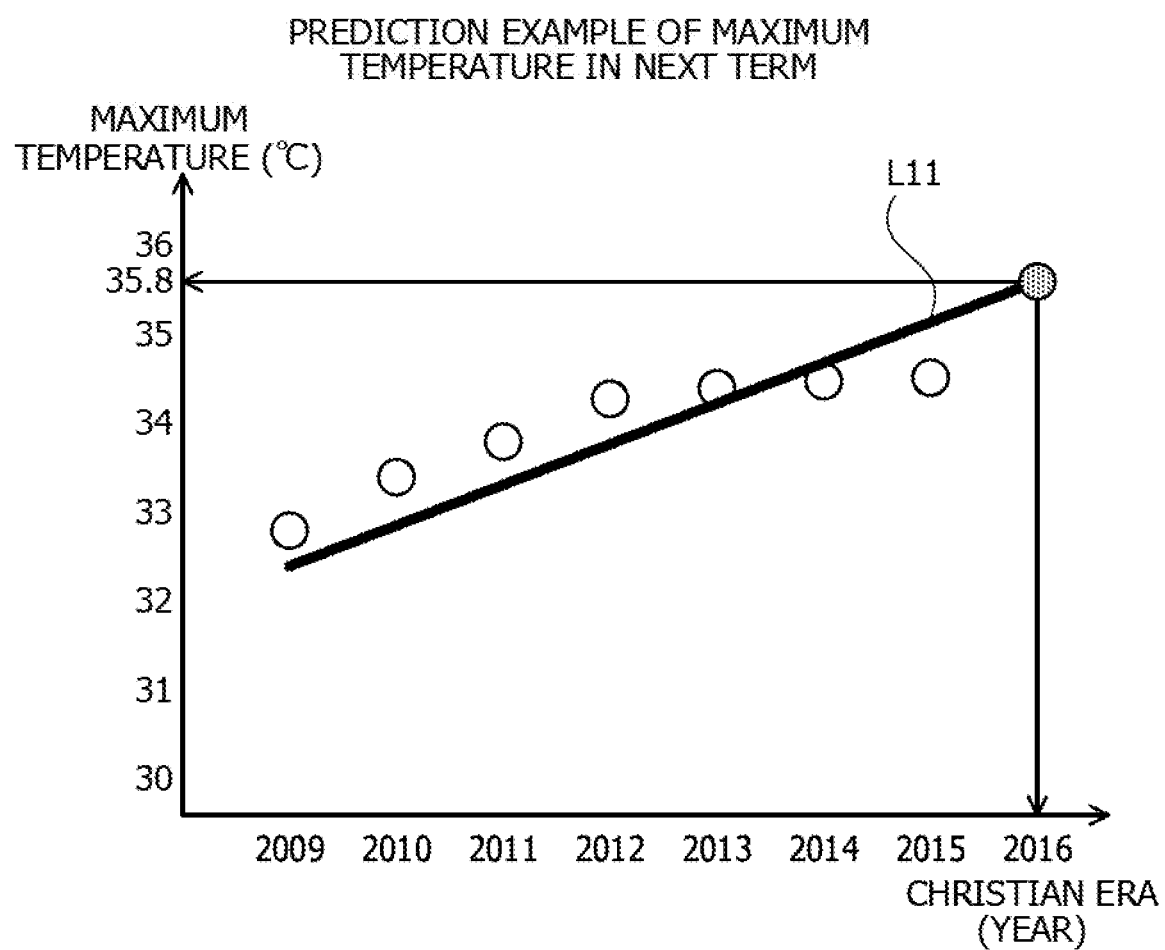
FIG. 9 is a diagram illustrating a prediction example of a maximum temperature in the next term.

FIG. 9 is a diagram illustrating a prediction example of a maximum temperature in the next term. FIG. 9 illustrates a relation between years and maximum temperatures with the Christian Era (year) plotted on the horizontal axis and a maximum temperature (° C.) of each year plotted on the vertical axis. The power calculating unit 130 calculates a regression formula corresponding to a regression line L11 (the regression formula may be a linear expression or may be a quadratic or higher-order expression) according to a regression analysis for results of maximum temperatures with respect to years. Then, the power calculating unit 130 can predict the maximum temperature Tu in the next term (for example, 2016) as, for example, 35.8° C. according to the calculated regression formula. On the other hand, as explained above, the power calculating unit 130 may predict a maximum temperature of this term (for example, 2015) as the maximum temperature Tu of the next term.

Note that, in step S12 in FIG. 8, the power calculating unit 130 calculates the lower limit value Td of the temperature range by subtracting the fixed value (in the example explained above, 7° C.) from the upper limit value Tu of the temperature range. On the other hand, the power calculating unit 130 may determine, based on the predicted maximum temperature and the regression formula and the evaluation value $Z\sigma$ calculated in step S11, the lower limit value Td of the temperature range. Specifically, the power calculating unit 130 calculates the lower limit value Td of the temperature range as explained below.

Figure 10:
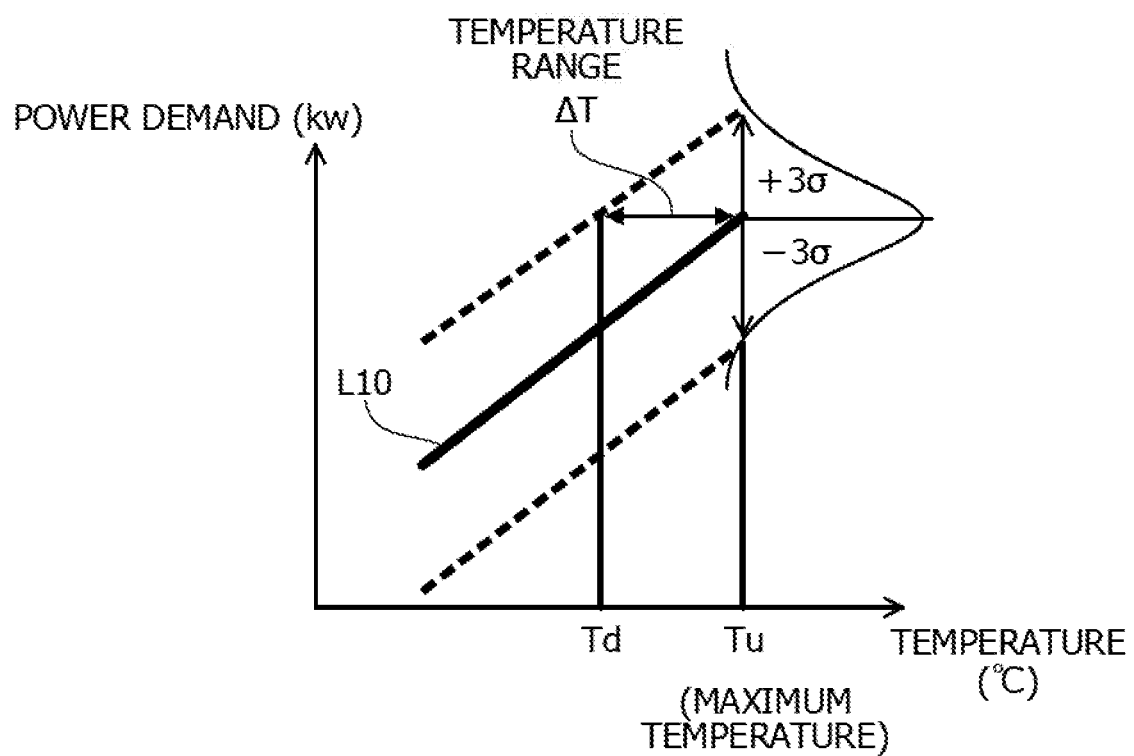
FIG. 10 is a diagram illustrating a determination example of a determination target temperature range.

FIG. 10 is a diagram illustrating a determination example of a determination target temperature range. The power calculating unit 130 determines, based on a correlation formula obtained by adding the evaluation value $Z\sigma$ to the calculated regression formula (Expression (2)), the lower limit value Td of the temperature range ΔT with respect to the maximum temperature Tu of the temperature range ΔT calculated by the method illustrated in FIG. 9. Specifically, the power calculating unit 130 sets the lower limit value Td as the lower limit value $Td=Tu-Z\sigma/a$ (in the example illustrated in FIG. 9, Z=3). That is, the power calculating unit 130 calculates the lower limit value Td of the temperature range ΔT by substituting, in the correlation formula, a power value calculated by substituting the maximum temperature Tu in the regression formula.

In this way, the power calculating unit 130 can also dynamically determine the temperature range ΔT. Then, it is possible to adjust according to a value of Z, whether the determination target temperature range is secured relatively narrow and a maximum power demand is predicted at a temperature closer to the maximum temperature Tu or the determination target temperature range is secured relatively wide and the maximum power demand is predicted irrespective of the maximum temperature Tu.

Further, in the procedure illustrated in FIG. 7, the analyzing unit 120 may calculate a relevance ratio (for example, an $R^2$ value or a p value) of the correlation coefficient "c" and determine whether to perform prediction of a power demand by the power result table 111. Specifically, the analyzing unit 120 determines whether to perform prediction of a power demand as explained below.

Figure 11:
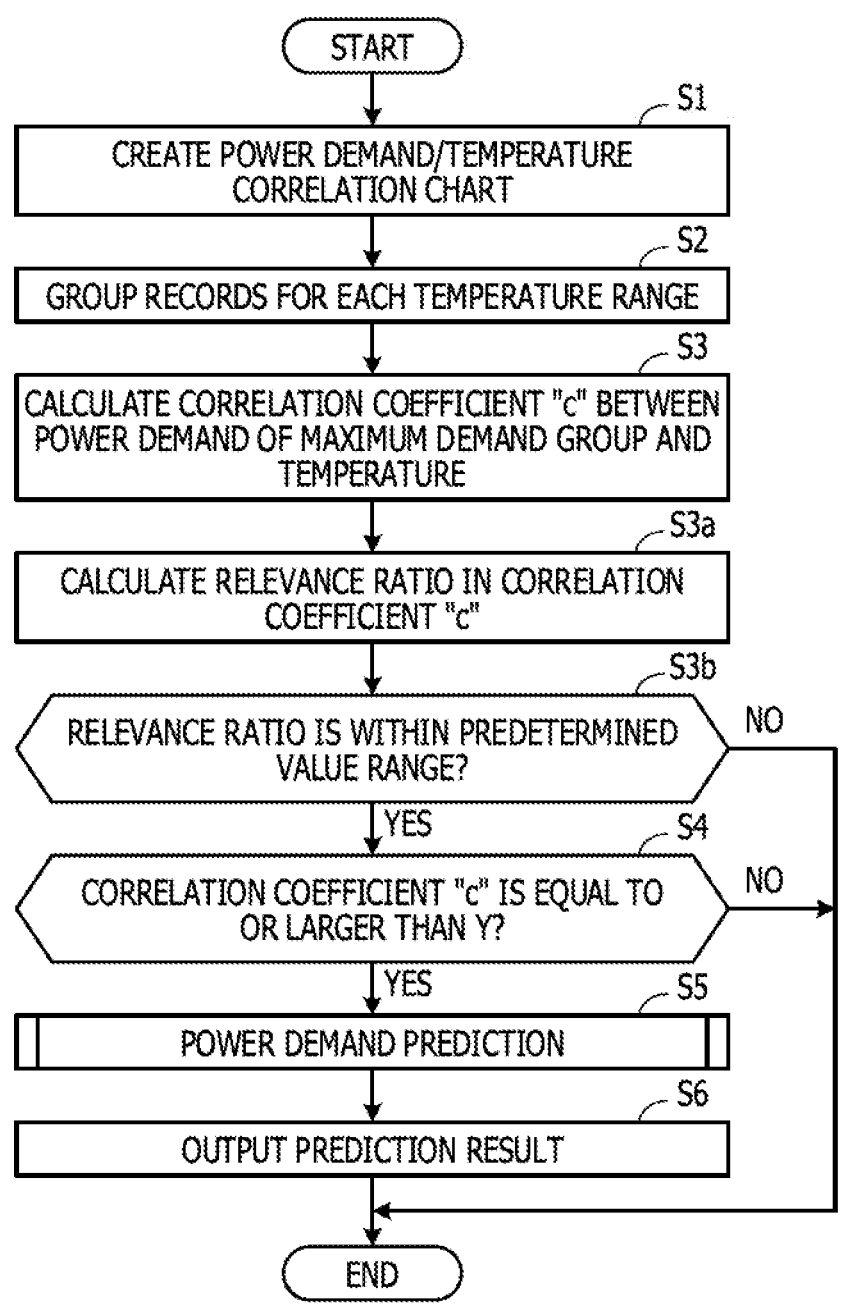
FIG. 11 is a flowchart illustrating another example of the analysis processing.

FIG. 11 is a flowchart illustrating another example of the analysis processing. The processing illustrated in FIG. 11 is explained below according to step numbers. The procedure illustrated in FIG. 11 is different from the procedure illustrated in FIG. 7 in that steps S3a and S3b are executed after step S3 and thereafter step S4 is executed according to determination in step S3b. Therefore, in the following explanation, steps S3a and S3b are mainly explained. Explanation of the other steps is omitted.

(Step S3a) The analyzing unit 120 calculates a relevance ratio in the correlation coefficient "c". As the relevance ratio, an $R^2$ value or a p value can be used. The $R^2$ value is an indicator indicating whether a regression line calculated from the power result table 111 is likely. The $R^2$ value is a real number between 0 and 1. When the $R^2$ value is 1, all plots of a temperature-to-power result value on a graph are present on the regression line. Conversely, when the $R^2$ value is 0, the plots of the temperature-to-power result value on the graph are in a scattered state irrespective of the regression line. The p value represents a probability of the correlation coefficient "c" calculated in step S3 being calculated when numerical values not correlated at all are combined. Reliability of the correlation coefficient "c" is higher as the p value is smaller. The reliability of the correlation coefficient "c" is lower as the p value is larger.

(Step S3b) The analyzing unit 120 determines whether the relevance ratio calculated in step S3a is within a predetermined value range. When the relevance ratio is within the predetermined value range, the analyzing unit 120 advances the processing to step S4. When the relevance ratio is not within the predetermined value range, the analyzing unit 120 ends the processing. For example, when the $R^2$ value is used as the relevance ratio, if the $R^2$ value calculated in step S3a is equal to or larger than a predetermined value (for example, 0.8), the relevance ratio (the $R^2$ value) is within the predetermined value range. If the $R^2$ value is smaller than the predetermined value, the relevance ratio (the $R^2$ value) is not within the predetermined value range. When the p value is used as the relevance ratio, if the p value calculated in step S3a is equal to or smaller than a predetermined value (for example, 0.05), the relevance ratio (the p value) is within the predetermined value range. If the p value is larger than the predetermined value, the relevance ratio (the p value) is not within the predetermined value range.

In this way, by using the relevance ratio in addition to the determination by the correlation coefficient "c" (step S4), the analyzing unit 120 can perform the prediction of a power demand only when the correlation between the temperature and the power result value is relatively strong. In this way, the power prediction server 100 can further improve the accuracy of the prediction of the maximum power demand.

Incidentally, in the example of the second embodiment, the method of focusing on the relation between the temperature and the power consumption and predicting the maximum power demand in the next term is mainly illustrated. On the other hand, as parameter related to a power demand, humidity, a product production amount of a factory, an order reception amount of a data center, the number of servers in operation, the number of people at work, the number of registered people, the number of facilities in operation, and the like are conceivable besides the temperature. It is also conceivable that the power prediction server 100 predicts the maximum power demand in the next term using these other parameters. Specifically, the power prediction server 100 predicts the maximum power demand in the next term as explained below.

Figure 12:
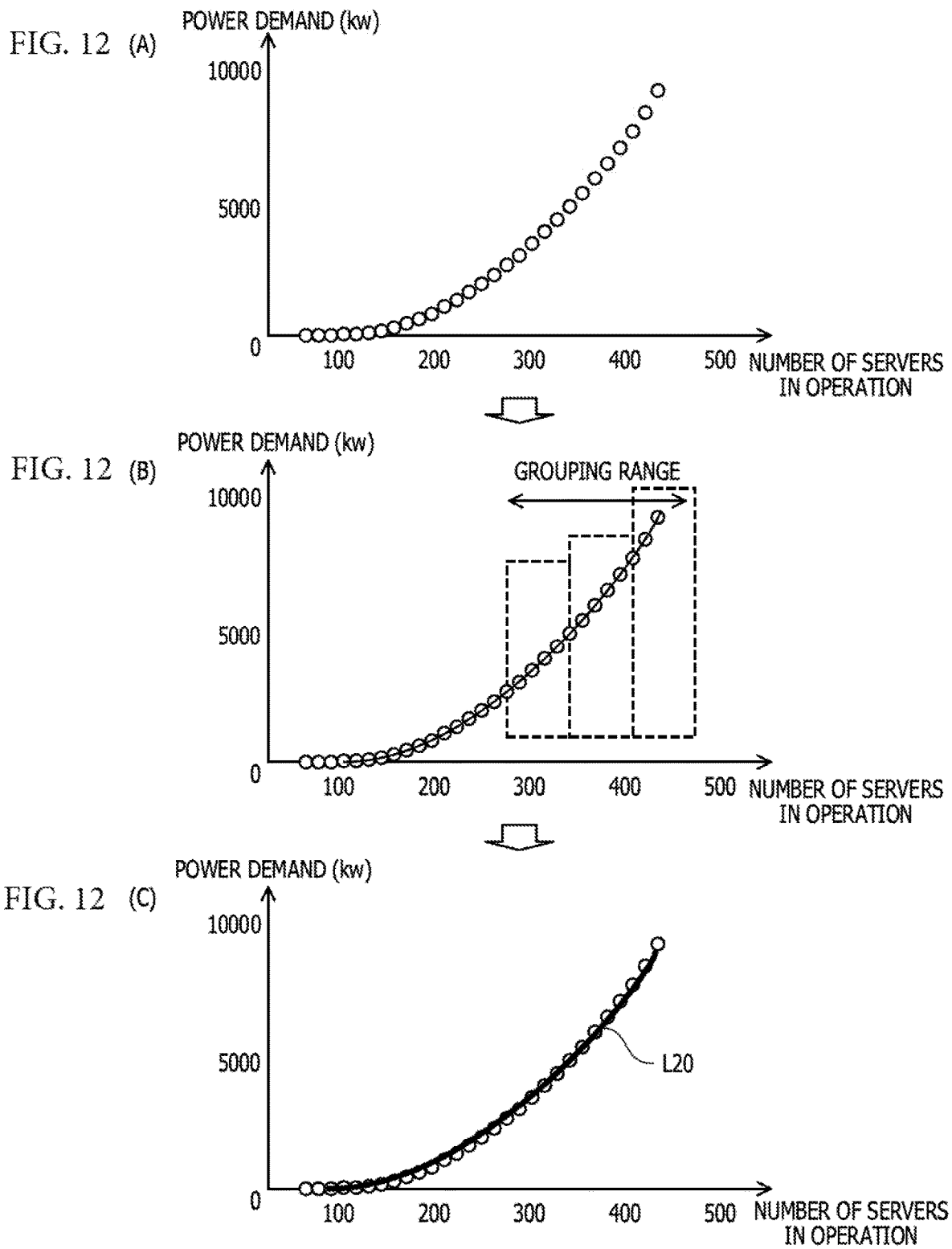
FIGS. 12(A)-12(C) are diagrams illustrating another analysis example.
Figure 13:
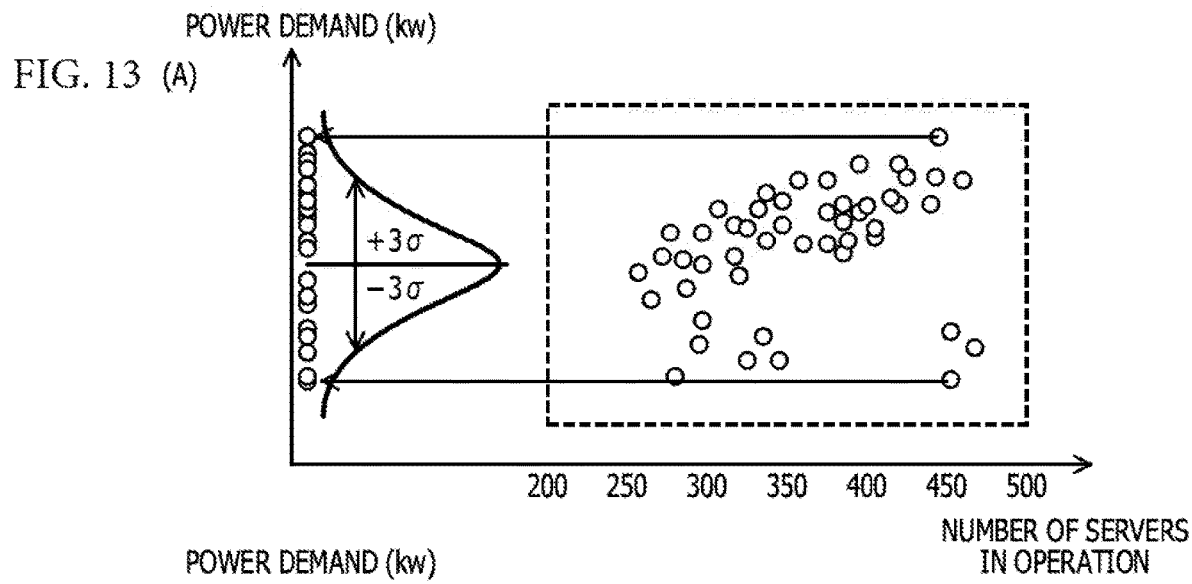
FIGS. 13(A)-13(C) are diagrams illustrating the other analysis example (following FIG. 12).
Figure 13:
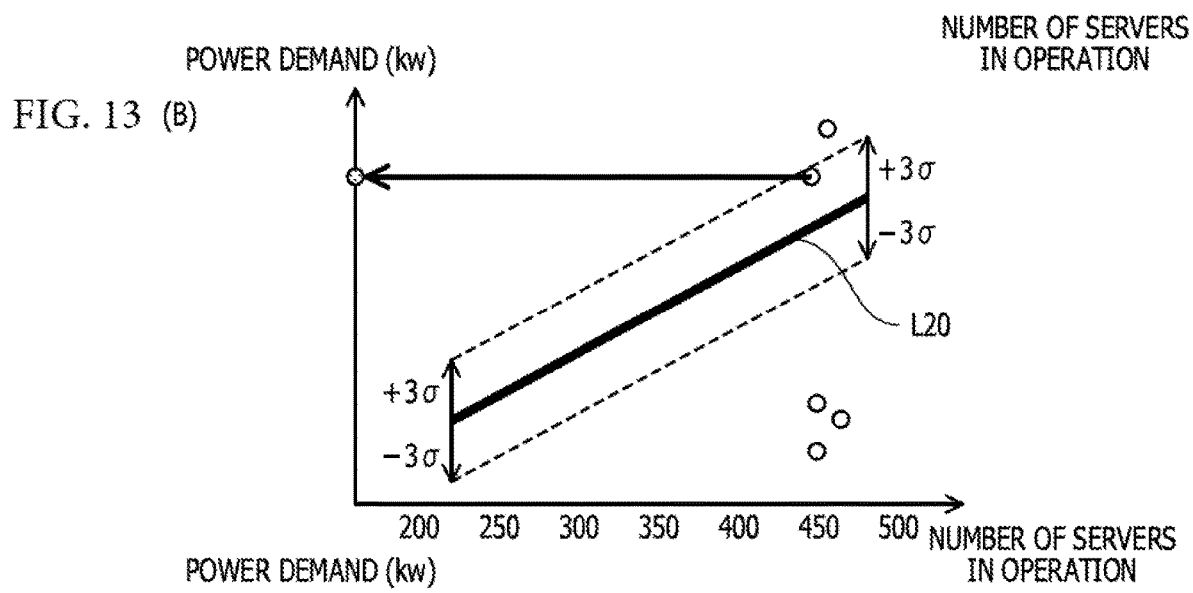
Figure 13:
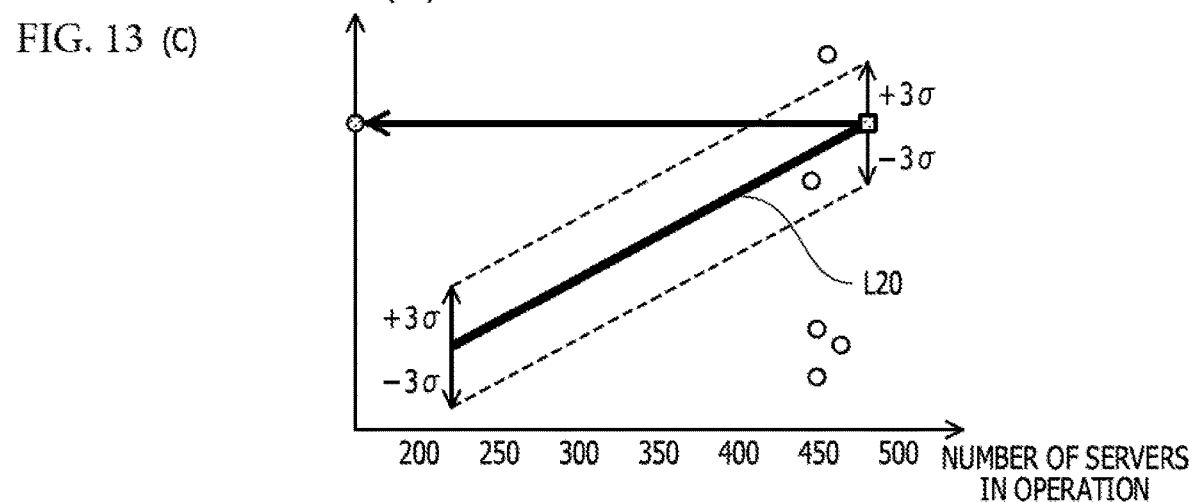

FIG. 12 is a diagram illustrating another example of the analysis. In FIGS. 12 and 13, a relation of a power demand (kW) with the number of servers in operation is illustrated. In graphs illustrated in FIGS. 12 and 13, the horizontal axis indicates the number of servers in operation and the vertical axis indicates a result value of a power demand (a power result value). The power prediction server 100 records the numbers of servers in operation and power result values in the past in the storing unit 110.

FIG. 12(A) is a diagram in which the power result value is plotted with respect to a result of the number of servers in operation. FIG. 12(B) is a diagram illustrating determination of a grouping range of the number of servers in operation. First, the power prediction server 100 divides the number of servers in operation into a plurality of ranges. In a relation between the number of servers in operation belonging to the ranges and the power result value, for example, a range determined as significant with the p value≤5% in a significant difference examination of a correlation coefficient by the p value is grouped (another limitation for determining that a significant difference is present such as 1% or less with respect to the p value may be applied). In an example illustrated in FIG. 12(B), the power prediction server 100 groups a range of the number of servers in operation of 300 to 450. In this way, records having a relatively strong correlation are extracted concerning the number of servers in operation and the power result value to increase accuracy of prediction of a power demand.

The power prediction server 100 calculates a regression formula representing a relation between the number of servers in operation and the power result value with respect to the grouped range. FIG. 12(C) illustrates a regression line L20 corresponding to the regression formula. In this example, the regression formula is represented by a quadratic expression. Specifically, the regression formula of the regression line L20 is represented by Expression (3).

$$Q = \alpha_1 \times N^2 + \alpha_2 \times N + b \quad (3) \qquad [\text{Math. 3}]$$

In Expression (3), Q represents a power value (unit is kW), N represents the number of servers in operation, a1 represents a first power demand change rate (unit is kW/server), a2 represents a second power demand change rate (unit is kW/server), and b represents an intercept (unit is kW). For example, the power calculating unit 130 can calculate values of a1, a2, and b of Expression (3) according to the method of least squares for the temperature and the power result value belonging to the maximum demand group. The power prediction server 100 can predict, based on Expression (3), a maximum power demand in the next term in the same manner as the method illustrated in FIG. 6.

FIG. 13 is a diagram illustrating the other example of the analysis (following FIG. 12). FIG. 13(A) represents fluctuation in power result values belonging to the grouped range. For example, among the power result values belonging to the group, there is a case in which power consumption suddenly decreases or increases irrespective of the number of servers in operation. The power calculating unit 130 discards such a case as an abnormal value. Specifically, the power calculating unit 130 calculates the evaluation value $Z\sigma$ explained above as an indicator indicating fluctuation in the power result values belonging to the group. The power calculating unit 130 sets, as normal values, values within a range of $Q(N)-Z\sigma$ or more and $Q(N)+Z\sigma$ or less among the power result values. On the other hand, the power calculating unit 130 sets, as abnormal values, values smaller than $Q(N)-Z\sigma$ or larger than $Q(N)+Z\sigma$ among the power result values. In FIG. 13(A), as an example, Z=3.

FIGS. 13(B) and 13(C) illustrate two patterns of the determination of the maximum power demand by the power calculating unit 130. Specifically, the power calculating unit 130 compares power result values within a normal range with a power calculation value. For example, the power calculating unit 130 can calculate a power calculation value by setting a maximum number of servers in operation in this term as a maximum number of servers in operation in the next term and substituting the maximum number of servers in operation in Expression (3). Alternatively, if there is a correlation between the terms and a change in the maximum number of servers in operation in the terms, the power calculating unit 130 may predict the maximum number of servers in operation in the next term according to a regression analysis.

When the power result values within the normal range are equal to or larger than the power calculation value, the power calculating unit 130 sets a maximum among the power result values within the normal range as a prediction value of a maximum power demand in the next term (in the case of FIG. 13(B)).

When the power result values within the normal range are smaller than the power calculation value, the power calculating unit 130 sets, as the prediction value of the maximum power demand in the next term, a value calculated by substituting the maximum number of servers in operation in the next term in Expression (3) (in the case of FIG. 13(C)).

In this way, when there is the correlation between the number of servers in operation and the power demand, the power prediction server 100 can also predict, based on the number of servers in operation and the result of the power demand with respect to the number of servers in operation, the maximum power demand in the next term.

In an office that treats a large amount of electric energy such as a factory or a laboratory, a reduction in an electricity rate expense is attempted. Therefore, when entering into an electricity rate contract, for example, an electrical chief engineer sometimes performs an electricity demand prediction for a contract target year from power demand results in the past, a scheduled production amount/an equipment introduction plane, and the like and determines contract power. However, a maximum power demand has a relatively large correlation with an electricity rate. It is likely that deviation between a prediction value of the maximum power demand and an actual power use amount increases. When the deviation between the prediction value and the actual power use amount is large, expenses caused by a difference of a power demand are wasted. Electrical chief engineers in offices endeavor to reduce deviation power between the contract power and the maximum power demand. However, some office enters into a contract with a contract power value of the previous year or maintains contact power in the past while leaving relatively large deviation power. Manual determination of the contract considerably depends on judgment of a person in charge of determination. Logical processing based on data in the past is not performed. An increase in an electricity rate expense due to deviation between prediction of a demand and an actual demand is a problem.

On the other hand, the power prediction server 100 calculates a regression formula from a result of a power demand in the past and, when power result values in a maximum demand group are smaller than a power calculation value calculated using the regression formula, calculates a maximum power demand value according to the regression formula. When the power result values are smaller than the power calculation value calculated using the regression formula, possibility that a power demand amount in future exceeds the maximum power demand value calculated from the regression formula is considered to be relatively low. Therefore, when the power result values are smaller than the power calculation value calculated using the regression formula, by calculating the maximum power demand value from the regression formula, it is possible to stop the maximum power demand value in future from being overestimated.

On the other hand, when the power result values in the maximum demand group are equal to or larger than the power calculation value calculated using the regression formula, the power prediction server 100 sets a result value of a maximum power demand in the past as a maximum power demand value to be predicted. This is because, in this case, possibility that the power result values exceed the maximum power demand value calculated from the regression formula is considered to be relatively high. By predicting the result value of the maximum power demand in the past as a maximum power demand value in the next term, it is possible to stop a maximum power demand value in future from being underestimated. In this way, the power prediction server 100 can support determination by the user of appropriate contract power with respect to a power demand in future.

Note that the information processing in the first embodiment can be realized by causing the arithmetic device 1b to execute the program. The information processing in the second embodiment can be realized by causing the processor 101 to execute the program. The program can be recorded in a computer-readable recording medium 13.

For example, it is possible to circulate the program by distributing the recording medium 13 in which the program is recorded. The program may be stored in another computer and distributed through a network. For example, the computer may store (install), in a storage device such as a RAM 102 or the HDD 103, the program recorded in the recording medium 13 or the program received from the other computer and read the program from the storage device and execute the program.

The above description simply indicates the principle of the present invention. Further, a large number of modifications and changes are possible for those skilled in the art. The present invention is not limited to the accurate configurations and the application examples illustrated and explained above. All modifications and equivalents corresponding to the accurate configurations and the application examples are regarded as being within the scope of the present invention by the appended claims and equivalents of the claims.

REFERENCE SIGNS LIST

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power-demand-value calculating system comprising:
a storage device configured to store data of combinations of temperatures and power result values; and
an arithmetic device configured to:
create a power demand and temperature correlation chart based on the data of the combinations;
make groups by dividing the power demand and temperature correlation chart with a specific temperature range;
calculate a regression formula for the one of the groups according to a regression analysis based on the data of the combinations;
select data with temperatures equal to or higher than a predetermined temperature from the storage device;
calculate, when the power result values corresponding to one of the temperatures of the selected data is smaller than a power calculation value which is calculated from the regression formula and the one of the temperatures of the selected data, a maximum power demand value based on the one of the temperatures of the selected data and the regression formula; and
determine, when the power result value corresponding to the one of the temperatures of the selected data is equal to or greater than the power calculation value, the power result value as the maximum power demand value.

2. The power-demand-value calculating system according to claim 1, wherein the arithmetic device is configured to calculate a correlation coefficient between the power result value and the temperature in one of the groups and select, as the one of the groups, a group corresponding to a maximum temperature zone from among the groups and calculate the regression formula when the correlation coefficient is equal to or more than a specific value.

3. The power-demand-value calculating system according to claim 1, wherein the arithmetic device calculates the maximum power demand value by substituting a maximum temperature, which is selected from the temperatures of the selected data as the one of the temperatures of the selected data, in the regression formula.

4. The power-demand-value calculating system according to claim 1, wherein the arithmetic device determines, based on a maximum temperature among the data of the combinations, the predetermined temperature.

5. The power-demand-value calculating system according to claim 1, wherein the arithmetic device: calculates a standard deviation of the power result values from the data of the combinations; calculates a correlation formula obtained by adding a value corresponding to the standard deviation to the regression formula; and selects, based on the correlation formula, a power result value used for comparison with the power calculation value among the power result values corresponding to the temperatures of the selected data.

6. The power-demand-value calculating system according to claim 1, wherein the arithmetic device: calculates a standard deviation of the power result values from the data of the combinations, calculates a correlation formula obtained by adding a value corresponding to the standard deviation to the regression formula; and calculates the predetermined temperature by substituting, in the correlation formula, a power value calculated by substituting a maximum temperature among the data of the combinations in the regression formula.

7. The power-demand-value calculating system according to claim 1, wherein the arithmetic device predicts, based on the data of the combinations, a maximum temperature in a predetermined period in future and determines the predetermined temperature according to the predicted maximum temperature.

8. The power-demand-value calculating system according to claim 7, wherein the arithmetic device calculates the maximum power demand value by substituting the predicted maximum temperature in the regression formula.

9. A power-demand-value calculating method, comprising:
creating a power demand and temperature correlation chart based on data of combinations each of a temperature and a power result value which is stored in a storage device;
making groups by dividing the power demand and temperature correlation chart with a specific temperature range;
calculating a regression formula for the one of the groups according to a regression analysis based on the data of the combinations;
selecting, by a computer, data with temperatures equal to or higher than a predetermined temperature from data of combinations of temperatures and power result values;
calculating, when the power result values corresponding to one of the temperatures of the selected data is smaller than a power calculation value which is calculated from the regression formula and the one of the temperatures of the selected data, a maximum power demand value based on the one of the temperatures of the selected data and the regression formula; and when the power result value corresponding to the one of the temperatures of the selected data is equal to or greater than the power calculation value, determining the power result value as the maximum power demand value.

10. The power-demand-value calculating method according to claim 9, further comprising:
calculating a correlation coefficient between the power result value and the temperature in one of the groups; and
selecting, as the one of the groups, a group corresponding to a maximum temperature zone from among the groups and calculate the regression formula when the correlation coefficient is equal to or more than a specific value.

11. The power-demand-value calculating method according to claim 9, wherein the maximum power demand value is calculated by substituting a maximum temperature, which is selected from the temperatures of the selected data as the one of the temperatures of the selected data, in the regression formula.

12. The power-demand-value calculating method according to claim 9, wherein the predetermined temperature is determined based on a maximum temperature among the data of the combinations.

13. The power-demand-value calculating method according to claim 9, further comprising: calculating a standard deviation of the power result values from the data of the combinations; calculating a correlation formula obtained by adding a value corresponding to the standard deviation to the regression formula; and selecting, based on the correlation formula, a power result value used for comparison with the power calculation value among the power result values corresponding to the temperatures of the selected data.

14. The power-demand-value calculating method according to claim 9, further comprising: calculating a standard deviation of the power result values from the data of the combinations, calculates a correlation formula obtained by adding a value corresponding to the standard deviation to the regression formula; and calculating the predetermined temperature by substituting, in the correlation formula, a power value calculated by substituting a maximum temperature among the data of the combinations in the regression formula.

15. The power-demand-value calculating method according to claim 9, further comprising: predicting, based on the data of the combinations, a maximum temperature in a predetermined period in future and determines the predetermined temperature according to the predicted maximum temperature.

16. The power-demand-value calculating method according to claim 15, wherein the maximum power demand value is calculated by substituting the predicted maximum temperature in the regression formula.

17. A non-transitory computer-readable recording medium recording a power-demand-value calculating program which causes a computer to execute processing for:
creating a power demand and temperature correlation chart based on data of combinations each of a temperature and a power result value which is stored in a storage device;
making groups by dividing the power demand and temperature correlation chart with a specific temperature range;
calculating a regression formula for the one of the groups according to a regression analysis based on the data of the combinations;

selecting data with temperatures equal to or higher than a predetermined temperature from data of combinations of temperatures and power result values;

calculating, when the power result values corresponding to one of the temperatures of the selected data is smaller than a power calculation value which is calculated from the regression formula and the one of the temperatures of the selected data, a maximum power demand value based on the temperatures of the selected data and the regression formula; and when the power result value corresponding to the one of the temperatures of the selected data is equal to or greater than the power calculation value, determining the power result value as the maximum power demand value.

18. The non-transitory computer-readable recording medium according to claim 17, further comprising:

calculating a correlation coefficient between the power result value and the temperature in one of the groups; and selecting, as the one of the groups, a group corresponding to a maximum temperature zone from among the groups and calculate the regression formula when the correlation coefficient is equal to or more than a specific value.

19. The non-transitory computer-readable recording medium according to claim 17, wherein the maximum power demand value is calculated by substituting a maximum temperature, which is selected from the temperatures of the selected data as the one of the temperatures of the selected data, in the regression formula.

20. The non-transitory computer-readable recording medium according to claim 17, wherein the predetermined temperature is determined based on a maximum temperature among the data of the combinations.

* * * * *